United States Patent [19]
Chang

[11] Patent Number: 5,652,440
[45] Date of Patent: Jul. 29, 1997

[54] GAAS-INGAAS HIGH ELECTRON MOBILITY TRANSISTOR

[75] Inventor: Chun-Yen Chang, Hsinchu, Taiwan

[73] Assignee: National Science Council, Taipei, Taiwan

[21] Appl. No.: 525,851

[22] Filed: Sep. 8, 1995

Related U.S. Application Data

[62] Division of Ser. No. 315,431, Sep. 30, 1994.

[51] Int. Cl.$^6$ .................... H01L 29/778; H01L 29/205
[52] U.S. Cl. ................................. 257/194; 257/20
[58] Field of Search ........................ 257/20, 194

[56] References Cited

U.S. PATENT DOCUMENTS 5,371,387  12/1994  Ando ........................... 257/194
5,404,032  4/1995  Sawada et al. ............... 257/194

OTHER PUBLICATIONS

Sawada et al, *IEEE Elec Dev. Lett* vol. 14 No. 7 Jul. 1993 "A New Two-Mode . . . Applications" pp. 354–356.
Hsu et al, *IEEE Trans. on Elec. Dev.* vol. 41 No. 3 Mar. 1994 pp. 456–457 "A High Performance . . . MOCVD".

*Primary Examiner*—Jerome Jackson
*Attorney, Agent, or Firm*—Lackenbach Siegel Marzullo Aronson & Greenspan, P.C.

[57] ABSTRACT

A GaAs-InGaAs high electron mobility transistor includes: a GaAs substrate; a GaAs buffer layer overlaying on the GaAs substrate; a graded InGaAs channel overlaying on the GaAs layer; a GaAs spacer layer overlaying on the graded InGaAs channel layer; a δ-doping layer overlaying on the GaAs spacer layer; a GaAs cap layer overlaying on the δ-doping layer; drain and source terminals overlaying on the GaAs cap layer and contacting the graded InGaAs channel layer; and a gate terminal overlaying on the GaAs cover layer and located between the drain terminal and the source terminal. One kind of modified transistor uses the symmetric channel δ-doping structure to replace the graded InGaAs channel of the transistor.

6 Claims, 2 Drawing Sheets

GAAS-INGAAS HIGH ELECTRON MOBILITY TRANSISTOR

This is a division of application Ser. No. 08/315,431 filed Sep. 30, 1994.

BACKGROUND OF THE INVENTION

The present invention relates generally to a GaAs-InGaAs high electron mobility transistor, and more particularly to a δ-doping GaAs/InGaAs/GaAs pseudomorphic high electron mobility transistor.

To date, most reports have concentrated on the AlGaAs/InGaAs modulation-doped high electron mobility transistors (HEMT) with better element property whose pseudomorphic structure that are grown by Molecular Beam Epitaxy (MBE) technique. The main reasons are: better bandgap discontinuity, channel mobility and saturation velocity result in higher 2-dimensional electron gas concentration than GaAs/InGaAs MOSFET. However, this prior art has following drawbacks: (1) In $Al_xGa_{1-x}As$, when x content is more than 0.2, the defects occur (i.e. DX centers). (2) The molecular-beam epitaxy (MBE) method cannot grow in mass production, while the metal organic chemical vapor deposition (MOCVD) method can produce massively but cannot produce high quality AlGaAs epilayer. (3) Although its transconductance is high, its gate operating voltage is always confined within or less than 1 volts, and therefore cannot be used effectively in linear amplification.

The drawbacks mentioned above limit the practical applications of pseudomorphic AlGaAs/InGaAs transistors.

SUMMARY OF THE INVENTION

In view of shortcomings as described above, it is an object of this invention to present two new high performance δ-doped GaAs/InGaAs/GaAs pseudomorphic high electron mobility transistors(δ-HEMTs). One utilizes a graded InGaAs channel, while the other uses double δ-doped GaAs layers grown symmetrically on both sides of the InGaAs channel, to successfully fabricate, for the first time, δ-HEMTs grown by low-pressure metalorganic chemical vapor deposition (LP-MOCVD). These new structures reveal superior characteristics over conventional homogeneously doped GaAs/InGaAs/GaAs as indicated in below: (1) no DX centers, (2) using MOCVD for mass production, (3) high transconductance relaxes the limit of the gate operating voltage range.

Moreover, because the graded composition of this invention places carriers away from doped layer interface, the mobility of electrons is raised, therefore enhancing the property of the transistors. The extrinsic transconductance and saturation current density are significantly superior to those of a conventional GaAs/InGaAs pseudomorphic structure.

BRIEF DESCRIPTION OF DRAWINGS

The present invention can be more fully understood by reference to the following detailed description and accompanying drawings, which form an integral part of this application, and wherein.

DETAILED DESCRIPTION OF PREFERRED EMBODIMENTS

The epilayers of this invention were grown on a (100)-oriented GaAs semi-insulating GaAs substrate by a computer-controlled LP-MOCVD. The conditions are listed in the following Table 1:

TABLE 1

| | |
|---|---|
| Chamber pressure | 80 Torr |
| Growth temperature | 650° C. |
| TEG (10° C.) flow rate | 5 cm³/min |
| TMI (10° C.) flow rate | 6.3 cm³/min |
| SiH₄ (500 ppm) flow rate | 100 cm³/min |
| AsH₃ (15%) flow rate | 0.08–0.12 l/min |

Wherein, trimethylindium(TMI), triethylgallium (TEG), arsine ($AsH_3$), and silane ($SiH_4$) were used as the In, Ga, As sources, and n-type of dopant, respectively. While the flow rates of $AsH_3$ were 0.12 l/min for InGaAs, and 0.08 l/min for GaAs.

Figure 1:
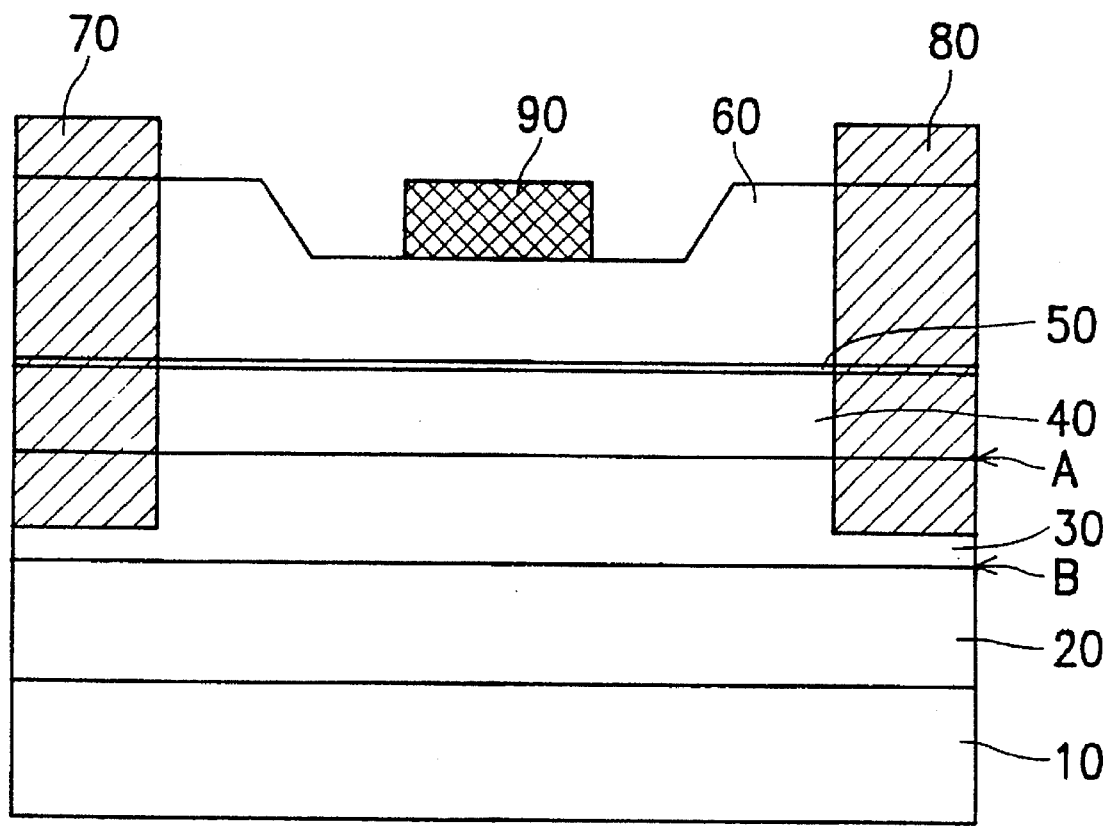
FIG. 1 is a cross-sectional diagram of a preferred embodiment.

Referring to FIG. 1, a preferred embodiment of this invention, includes: a GaAs substrate 10; a graded InGaAs channel 30; a GaAs spacer layer 40; a δ-doped layer 50, in which the dopant is silicon; a GaAs cap layer 60; a source terminal 70; a drain terminal 80; and a gate terminal. The fabrication includes the following steps: (1) on an undoped GaAs substrate 10, utilize low-pressure metal-organic MOCVD to grow a GaAs buffer layer 20 of thickness about 5000 Å, a graded InGaAs channel 30 of thickness about 90 Å, a GaAs spacer layer 40 of thickness about 80 δ, a δ-doping layer 50, and a GaAs cap layer 60; (2) the finished epitaxy must be oriented before fabricated into the transistors, lest it breaks during the process of fabricating gate metal; wash away the grease on the surface of epitaxy; assign the positions of the drain and the source on the GaAs cap layer 60; then apply the alloy of 88% gold and 12% germanium(Ge) to the drain and the source, with a silver coating; finally place it into an oven of 450° C. for sintering, thus the drain terminal 80 and the source terminal 70 form an ohmic contact with the graded InGaAs channel 30; (3) make a groove between source 70 and drain 80 to separate every element thus avoiding interference. This groove defines the place for the gate terminal 90 which is formed with a layer of gold.

The graded InGaAs channel 30 has a chemical composition in the form of $In_xGa_{1-x}As$, and x stands for the gradually varying amount of 0.2 at the interface A and 0.25 at interface B. This formation variation may be accomplished by computer-controlling the flow rates of TMI and TEG.

The graded channel obtained by the above method has the following features: (1) the carriers are located on the interface of the channel layer 30 and the buffer layer 20 which is away from the δ-doped layer 50, thereby reducing the effect of ionized impurity scattering and enhancing the mobility; (2) Because of the high concentration of the carriers in the interface of the channel layer 30 and buffer layer 20, it can maintain high transconductance when reverse biased at the gate terminal 80.

Figure 2:
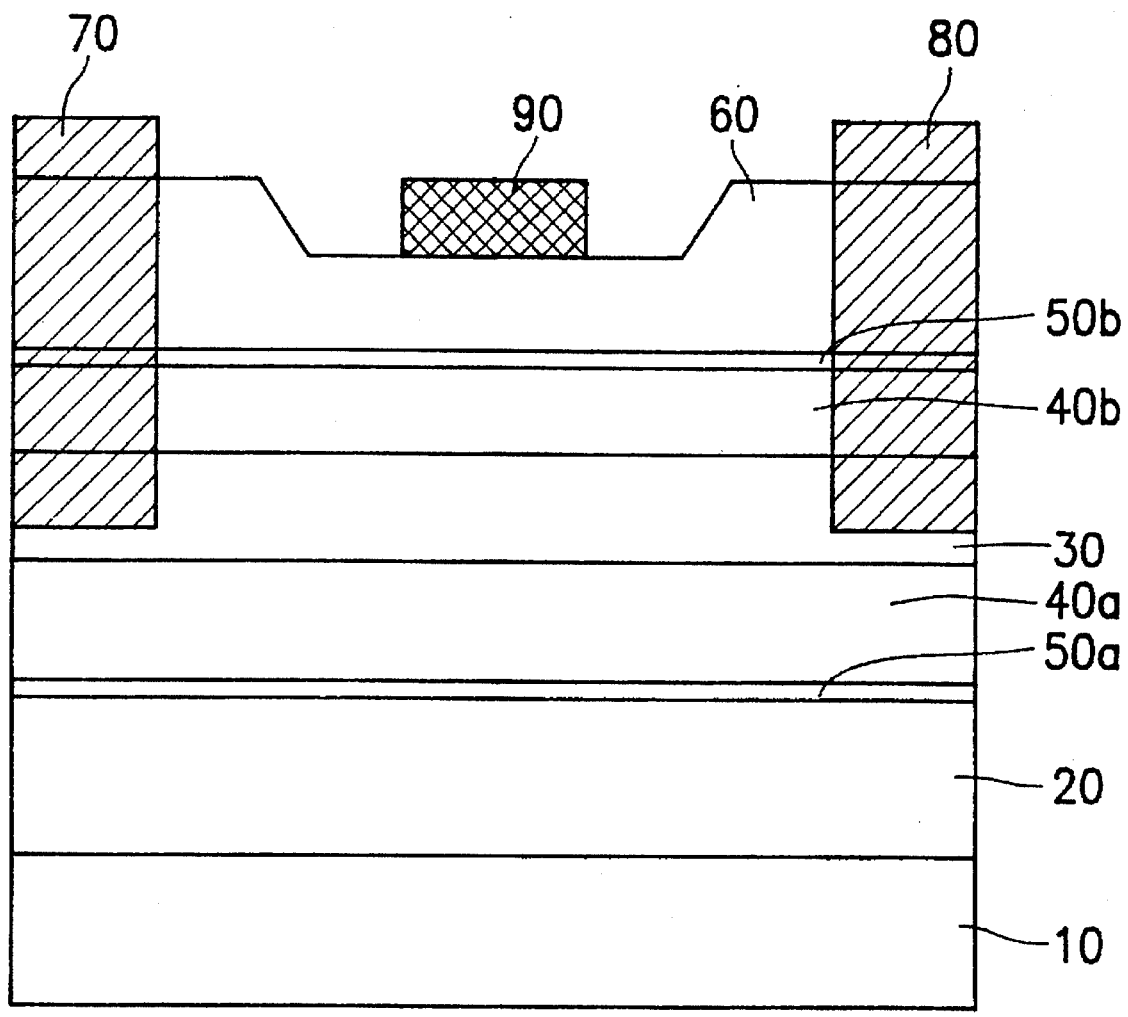
FIG. 2 is a cross-sectional diagram of another preferred embodiment.

Another preferred embodiment as in FIG. 2, which replaces the graded InGaAs channel with a symmetric channel includes the following: a GaAs substrate 10; a GaAs buffer layer 20; a first δ-doped layer 50a; a first GaAs spacer layer 40a; an InGaAs channel layer 30; a second GaAs spacer layer 40b; a second δ-doped layer 50b; a GaAs cap layer 60; a source terminal 70; a drain terminal 80, a gate terminal 90. The dopant of the first and second δ-doped layers 50a, 50b is silicon. Wherein the first δ-doped layer 50a, the first GaAs spacer layer 40a, the InGaAs channel layer 30, the second GaAs spacer layer 40b; and the second δ-doped layer 50b constitute the symmetrical channel's δ-doped structure that features: (1) double doping that enhances the concentration of 2-dimensional electrons and increases transconductance for gate voltage operating range; (2) because high concentration of 2-dimensional electrons means high mobility, the density of saturation current and transconductance is very high.

The fabrication procedure of symmetrical channel δ-doped transistors includes the steps of: (1) according to the growth conditions of MOCVD, an undoped GaAs substrate 10, grow a GaAs buffer layer 20 of thickness about $10^4$ Å, a first δ-doping layer 50a, a first GaAs spacer layer 40a of thickness about 100 Å, an InGaAs channel layer 30 of thickness about 90 Å (wherein the composition is $In_{0.25}Ga_{0.75}As$), a second GaAs spacer layer 40b of thickness about 100 Å, a second δ-doping layer 50b, and a GaAs cap layer 60 of thickness about 400 Å; (2) the finished epitaxy must be oriented before fabricated into the transistors; wash away the grease on the surface of epitaxy; assign the positions of the drain and the source on the GaAs cap layer 60; then apply the alloy of gold and germanium (Ge) to the drain and the source, with a silver coating; finally place it into an oven of 450° C. for sintering, thus the drain terminal 80 and the source terminal 70 form an ohmic contact with the graded InGaAs channel 30; (3) make a groove in the GaAs cap layer 60 between source 80 and drain 70. In this groove define the place for the gate terminal 90 which is coated with a layer of gold.

In the above embodiments, growth of δ-doping layer is based on the conditions listed in Table 1: closing TEG and letting $SiH_4$ and $AsH_3$ flow. The process takes about 0.2 minutes.

The invention has been described above in terms of some important, preferred embodiments; however, this invention is not limited to the disclosed embodiments. On the contrary, for a person skilled in the art, it is intended to cover various modifications and similar arrangements included within the spirit and scope of the appended claims, the scope of which should be accorded the broadest possible interpretation so as to encompass all such modifications and similar structures and processes.

What is claimed is:

1. A GaAs-InGaAs transistor overlaying on a GaAs substrate comprising: a GaAs buffer layer overlaying on the GaAs substrate; a graded InGaAs channel layer overlaying on said GaAs buffer layer, a GaAs spacer layer overlaying on said graded InGaAs channel layer; a δ-doped layer overlaying said GaAs spacer layer; a GaAs cap layer overlaying on said δ-doped layer; a drain terminal and a source terminal overlaying on said GaAs cap layer and interfacing with said graded InGaAs channel layer; and a gate terminal overlaying on said GaAs cap layer and being located between said drain and source terminals, the content ratio of In and Ga varying from the interface between said graded InGaAs channel layer and said GaAs spacer layer to the interface between said graded InGaAs channel layer and said GaAs buffer layer being represented by a chemical form $In_xGa_{1-x}As$, wherein x has a value within the range from 0.2 to 0.25.

2. A GaAs-InGaAs transistor as claimed in claim 1, wherein said GaAs buffer layer is approximately 5000 Å thick.

3. A GaAs-InGaAs transistor as claimed in claim 2, wherein said graded InGaAs channel layer is approximately 90 Å thick.

4. A GaAs-InGaAs transistor as claimed in claim 3, wherein said GaAs spacer layer is approximately 80 Å thick.

5. A GaAs-InGaAs transistor as claimed in claim 4, wherein the dopant of said δ-doped layer is silicon.

6. A GaAs-InGaAs transistor as claimed in claim 5, wherein said GaAs cap layer is approximately 400 Å thick.

* * * * *